United States Patent
Lee

(10) Patent No.: US 7,505,322 B2
(45) Date of Patent: Mar. 17, 2009

(54) METHOD FOR READING NAND FLASH MEMORY DEVICE USING SELF-BOOSTING

(75) Inventor: Min Kyu Lee, Gwangju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 62 days.

(21) Appl. No.: 11/770,687

(22) Filed: Jun. 28, 2007

(65) Prior Publication Data

US 2008/0158971 A1  Jul. 3, 2008

(30) Foreign Application Priority Data

Dec. 29, 2006  (KR) .................. 10-2006-0138809

(51) Int. Cl.
*G11C 11/34* (2006.01)

(52) U.S. Cl. .............................. 365/185.17; 365/185.25

(58) Field of Classification Search ............ 365/185.17, 365/185.25, 185.12
See application file for complete search history.

(56) References Cited

U.S. PATENT DOCUMENTS

| | | | |
|---|---|---|---|
| 5,991,202 A | 11/1999 | Derhacobian et al. | |
| 6,049,494 A | 4/2000 | Sakui | |
| 6,434,042 B1 * | 8/2002 | Lee et al. | 365/185.12 |
| 6,707,714 B2 | 3/2004 | Kawamura | |
| 6,826,082 B2 * | 11/2004 | Hwang et al. | 365/185.17 |
| 6,967,874 B2 | 11/2005 | Hosono | |
| 7,035,143 B2 * | 4/2006 | Lee | 365/185.17 |
| 7,149,124 B2 | 12/2006 | Nazarian | |
| 7,177,977 B2 | 2/2007 | Chen et al. | |
| 2008/0101128 A1 * | 5/2008 | Kim | 365/185.25 |

* cited by examiner

*Primary Examiner*—Anh Phung
(74) *Attorney, Agent, or Firm*—Townsend and Townsend and Crew LLP

(57) ABSTRACT

A method for reading a NAND flash memory device is provided. The NAND flash memory device includes a first bit line that is selected and a second bit line that is not selected. Each bit line is connected to a cell string including a string selection transistor, a plurality of memory cell transistors, and a source selection transistor connected in series. In the method, first, the first bit line is precharged while power supply voltage is applied to the second bit line. The string selection transistors are turned on and a read voltage is applied to a selected memory cell while a pass voltage is applied to unselected memory cells. The state of the selected memory cell transistor is detected according to whether or not charge precharged on the first bit line has been discharged.

9 Claims, 6 Drawing Sheets

METHOD FOR READING NAND FLASH MEMORY DEVICE USING SELF-BOOSTING

CROSS-REFERENCES TO RELATED APPLICATIONS

The present application claims priority to Korean patent application number 10-2006-138809, filed on Dec. 29, 2006, which is incorporated by reference in its entirety.

BACKGROUND OF THE INVENTION

The present invention relates to a NAND flash memory device and more particularly to a method for reading a NAND flash memory device which reduces a read disturb that may occur during a read operation.

Flash memory devices are widely used in a variety of electronic application fields in which nonvolatile memory devices are employed. A flash memory device typically uses a floating gate transistor as a unit cell and provides high memory density, high reliability, and low power consumption. Generally, flash memory devices are used in portable computers, personal digital assistants (PDAs), digital cameras, mobile phones, and the like. In addition, program code, system data such as a basic input/output system (BIOS), and firmware can also be stored in flash memory devices. The range of use of NAND flash memory devices has gradually increased recently since NAND flash memory devices can achieve a high memory density at a relatively low cost.

FIG. 1 illustrates a cell string structure of a general NAND flash memory device. FIG. 2 illustrates threshold voltage distributions of a NAND flash memory device in the erased and programmed states.

As shown in FIG. 1, a string 100 includes a string selection transistor 110, a source selection transistor 120, and a plurality of memory cell transistors 131, 132, and 133. The memory cell transistors 131, 132, and 133 are connected in series through their common drain/source regions. The string selection transistor 110 is positioned between a bit line BL and the memory cell transistors 131, 132, and 133. The source selection transistor 120 is positioned between a cell source line CSL and the memory cell transistors 131, 132, and 133. The gate of the string selection transistor 110 is connected to a drain selection line DSL. The gate of the source selection transistor 120 is connected to a source selection line SSL. The string and source selection transistors 110 and 120 are general MOS transistors and the memory cell transistors 131, 132, and 133 are floating gate transistors. Each of the memory cell transistors 131, 132, and 133 can be in the erased or programmed state.

As shown in FIG. 2, the memory cell transistors 131, 132, and 133 have a distribution of relatively low threshold voltages (e.g., below 0V) when they are in the erased state (see "210"). On the other hand, the memory cell transistors 131, 132, and 133 have a distribution of relatively high threshold voltages (e.g., higher than 0V) when they are in the programmed state (see "220")).

A read operation of a memory cell transistor is generally performed on a page basis. For example, to read the state of a selected memory cell transistor 132, first, the bit line BL of the cell string 100 containing the selected memory cell transistor 132 is precharged (e.g., with a level of 1V or 2V). Then, the drain selection transistor 110 and the source selection transistor 120 are turned on to form an electrical path in the selected cell string. In addition, a pass voltage Vpass is applied to the word lines of the remaining memory cell transistors 131 and 133, which are not selected, so that the remaining memory cell transistors 131 and 133 are turned on regardless of their states.

A read voltage (e.g., 0V) is applied to the word line of the selected memory cell transistor 132. Current flows or does not flow through the entire cell string 100 depending on the state of the selected memory cell transistor 132 since all the memory cell transistors, other than the selected transistor 132, of the cell string 100 are turned on. If the selected memory cell transistor 132 is in the erased state, the selected memory cell transistor 132 is turned on and therefore current flows through the entire cell string 100. This results in a discharge of the bit line BL, so that the voltage precharged on the bit line BL drops to 0V. On the other hand, if the selected memory cell transistor 132 is in the programmed state, the selected memory cell transistor 132 is turned off and therefore no current flows through the cell string 100, so that the voltage precharged on the bit line BL is kept unchanged. In this manner, the state of the selected memory cell transistor 132 can be determined based on whether or not the precharged voltage on the bit line BL has dropped to 0V.

However, if a bit line connected to a memory cell transistor that is turned off (hereinafter referred to as an "OFF bit line") neighbors bit lines connected to cell transistors that are turned on when the read operation is performed in the above manner, a bit line coupling phenomenon may occur to cause the voltage precharged on the OFF bit line to be reduced when the voltage precharged on the neighboring bit lines drops to 0V. Recently, as the memory capacity has increased, the bit line pitch has gradually decreased with the coupling coefficient increasing above 80%, which can cause the voltage precharged on the OFF bit line to be reduced by up to 20%. Recently, a bit line shielding technology has been introduced to suppress such a bit line coupling.

FIG. 3 illustrates a cell string structure of a NAND flash memory device to which the bit line shielding technology is applied.

As shown in FIG. 3, all bit lines are divided into even bit lines BLe and odd bit lines BLo and memory cell transistors are alternately arranged in the even bit lines BLe and the odd bit lines BLo. To determine the state of a selected memory cell transistor 332, the even bit lines BLe are precharged while the odd bit lines BLo are grounded. Each of the grounded odd bit lines BLo serves as a shielding line to suppress bit line coupling that affects the OFF bit line. Coupling between even bit lines BLe is negligible since they are spaced at sufficient intervals. In this case, a read disturb may also occur if the pass voltage Vpass applied to the word lines of memory cell transistors that are not selected exceeds a specific level.

Recently, a multi-level cell (MLC) structure has been increasingly used, instead of a single level cell (SLC). In the MLC structure which has at least four threshold voltage distributions, threshold voltage distributions are more closely arranged between the pass voltage Vpass and the read voltage Vread used to distinguish between the erased and programmed states, when compared to the SLC structure which has only two threshold voltage distributions. Thus, the MLC structure causes a variety of problems such as performance degradation due to cycling.

Increasing the pass voltage Vpass increases the amount of current that flows and is thus advantageous for sensing. However, if the pass voltage Vpass is increased the bias between the channels and the word lines of unselected memory cell transistors connected to the odd bit line BLo is also increased, raising the probability of a read disturb.

BRIEF SUMMARY OF THE INVENTION

In one embodiment, a method for reading a NAND flash memory device includes applying a first voltage to a first bit line coupled to a first cell string, the first cell string including a first string selection transistor, a plurality of first memory cells, and a first source selection transistor. A second voltage is applied to a second bit line coupled to a second cell string, the second cell string including a second string selection transistor, a plurality of second memory cells, and a second source selection transistor. The first and second string selection transistors are turned on. A read voltage is applied to a word line associated with one of the first memory cells that is selected for reading. A pass voltage is applied to a word line associated with one of the first memory cells that is not selected for reading. A state of the selected memory cell is determined according to a voltage condition associated with the first bit line. The second voltage applied to the second bit line reduces a potential difference between a gate and a channel of the unselected memory cell.

In another embodiment, a method for reading a NAND flash memory device is provided. The device includes a first bit line that is selected and a second bit line that is not selected, each of the first and second bit lines being connected to a cell string including a string selection transistor, a plurality of memory cell transistors, and a source selection transistor that are connected in series. The method comprises precharging the first bit line while applying a power supply voltage to the second bit line; turning on the string selection transistors, applying a read voltage to a word line of a selected one of the memory cell transistors, and applying a pass voltage to a word line of a remaining one of the memory cell transistors; and detecting a state of the selected memory cell transistor according to whether or not charge precharged on the first bit line has been discharged.

The method may further comprise discharging the first and second bit lines and setting a page buffer connected to the first and second bit lines.

The source selection transistor of the first bit line may be connected to a first cell source line, the source selection transistor of the second bit line may be connected to a second cell source line, and the first and second cell source lines may be separated from each other.

The cell source line of the first bit line may be grounded and a specific voltage level may be applied to the cell source line of the second bit line.

The voltage level applied to the cell selection line of the second bit line may be equal to the level of the power supply voltage applied to the second bit line.

The power supply voltage applied to the second bit line may be equal to or higher than a bias for turning on the string selection transistor and the source selection transistor.

The pass voltage applied to the word line of the remaining memory cell transistor that is not selected may be equal to or higher than 5.5V.

DETAILED DESCRIPTION OF THE INVENTION

Embodiments of the present invention will now be described in detail with reference to the accompanying drawings. The embodiments of the present invention may be modified into various other forms and the scope of the present invention should not be construed as limited by the embodiments described below.

Figure 1:
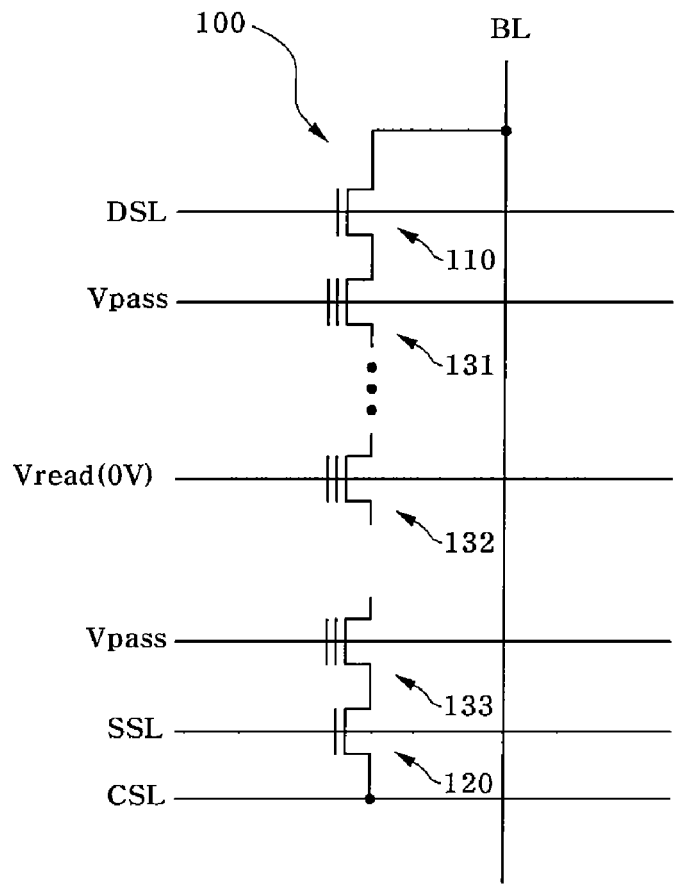
FIG. 1 illustrates a cell string structure of a general NAND flash memory device.
Figure 2:
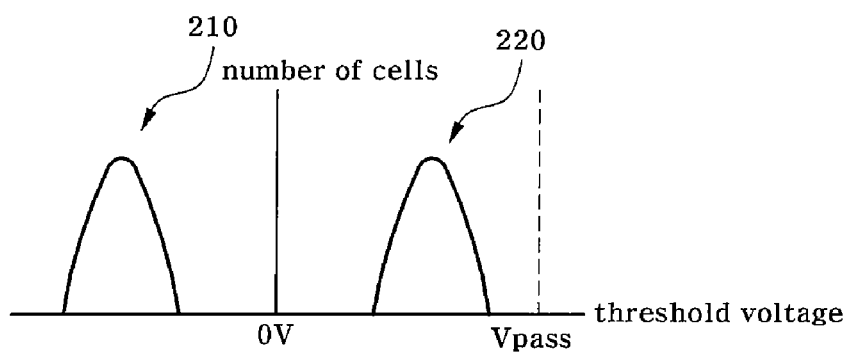
FIG. 2 illustrates threshold voltage distributions of a NAND flash memory device in the erased and programmed states.
Figure 3:
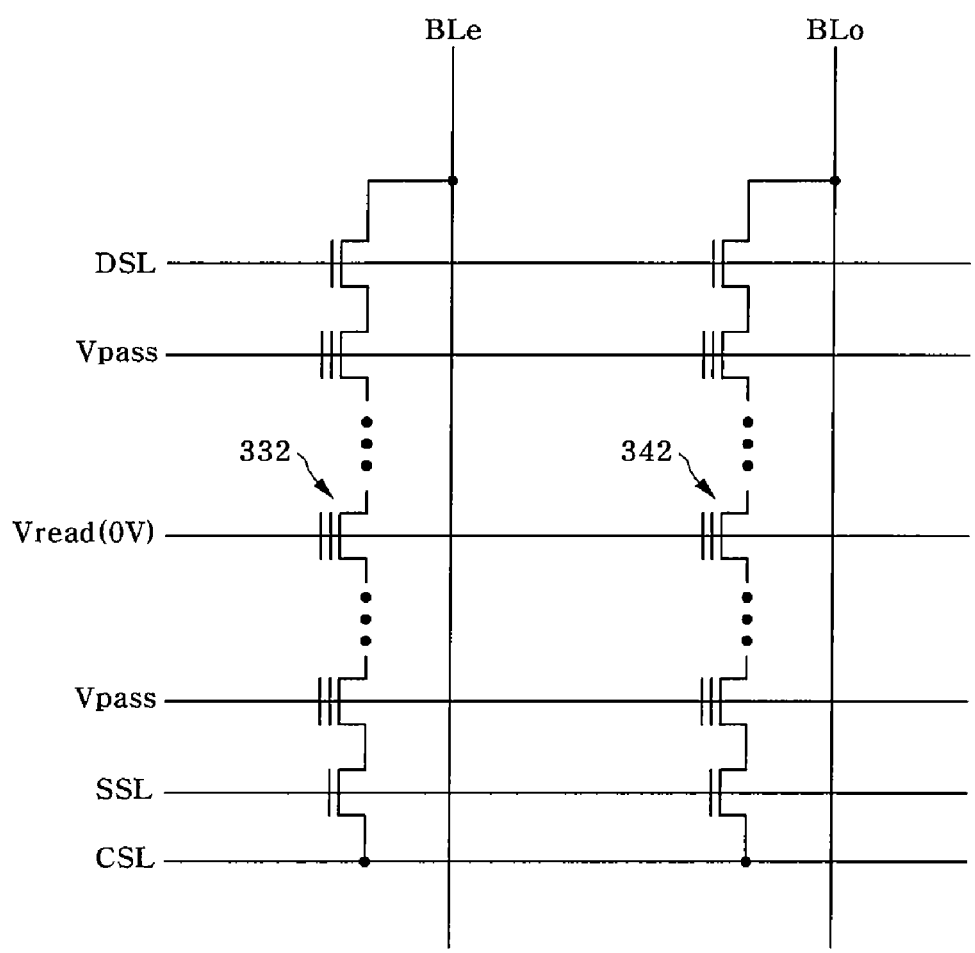
FIG. 3 illustrates a cell string structure of a NAND flash memory device to which the bit line shielding technology is applied.
Figure 4:
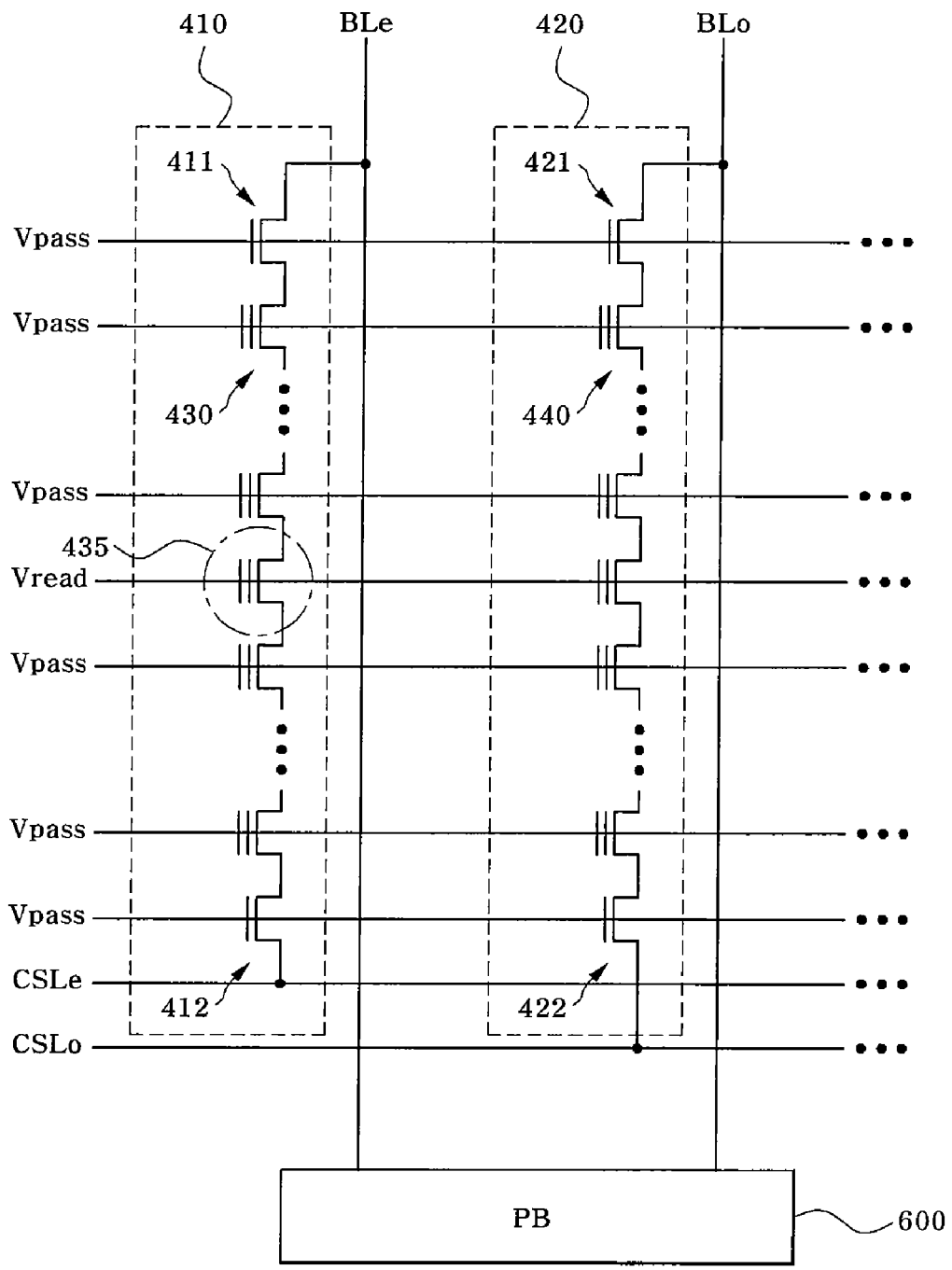
FIG. 4 illustrates a string structure of a NAND flash memory device to explain a method for reading a NAND flash memory device according to the present invention.

FIG. 4 illustrates a string structure of a NAND flash memory device to explain a method for reading a NAND flash memory device according to the present invention. As shown in FIG. 4, the NAND flash memory device has a memory cell array as a storage area to store data. The memory cell array includes a plurality of cell strings 410 and 420 that are connected to corresponding bit lines BLe and BLo. Of course, a number of cell strings are arranged in the memory cell array although only two cell strings 410 and 420 are shown in FIG. 4. Each of the cell strings 410/420 includes a string selection transistor 411/421 connected to a bit line BLe/BLo, a source selection transistor 412/422 connected to a cell source line CSLe/CSLo, and a plurality of cell transistors 430/440 positioned in series between the string selection transistor 411/421 and the source selection transistor 412/422. The cell string 410 connected to the even bit line BLe and the cell string 420 coupled to the odd bit line BLo are connected to different cell source lines CSLe and CSLo, respectively, in the present embodiment.

When bit line shielding is applied, the plurality of memory cell transistors 430/440 are alternately arranged in the cell strings 410 and 420 connected to the even and odd bit lines BLe and BLo. The even and odd bit lines BLe and BLo are connected to a page buffer (PB) 600. The page buffer (PB) 600 operates as a sensing amplifier during a read/verification operation and functions as a driver for driving the bit lines according to data to be programmed during a programming operation. The structure and operation of the page buffer 600 will be described in more detail later.

Figure 5:
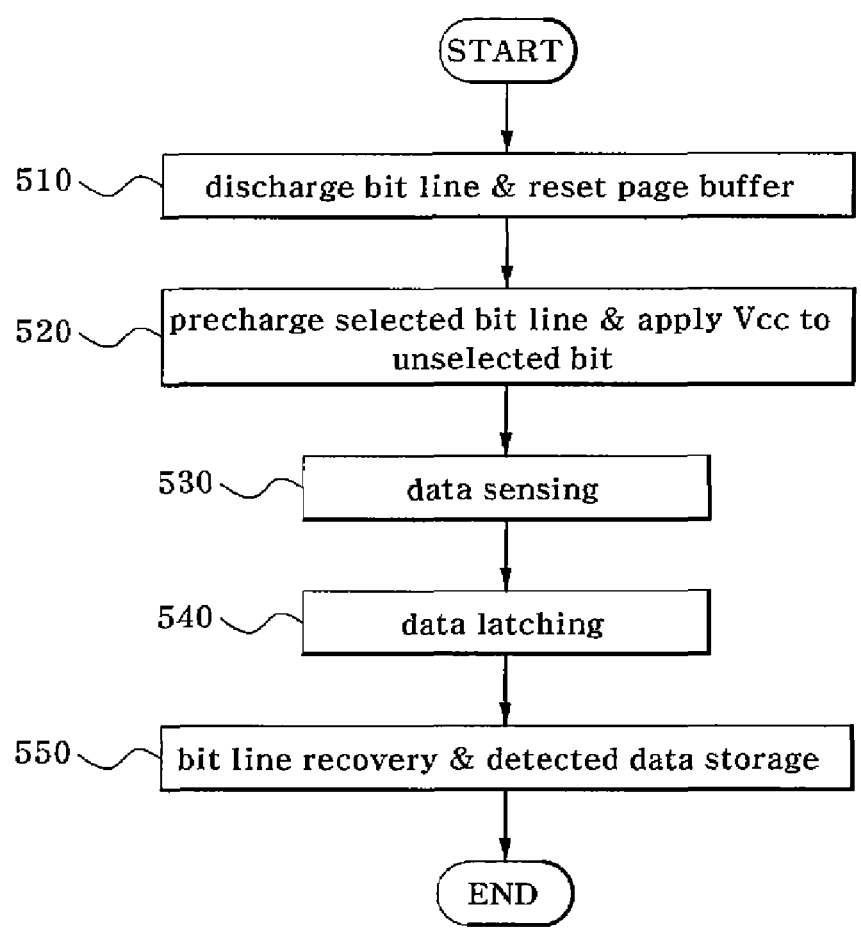
FIG. 5 is a flow chart illustrating a method for reading a NAND flash memory device according to the present invention.

FIG. 5 is a flow chart illustrating a method for reading a NAND flash memory device according to the present invention. In the following, the method shown in FIG. 5 is exemplified by sensing of the state of a specific memory cell transistor 435 (see FIG. 4) among the plurality of memory cell transistors 430 connected to the even bit line BLe. First, all charges remaining on the even and odd lines BLe and BLo are discharged and the page buffer 600 is reset (step 510). Then, a selected bit line (e.g., the even bit line BLe connected to the memory cell transistor 435 selected for sensing) is precharged, and the power supply voltage Vcc is applied to an unselected bit line (e.g., the odd bit line BLo) (step 520). The reason for applying the power supply voltage Vcc to the odd bit line BLo (or the unselected bit line) is to boost the channel bias of each of the memory cell transistors 440 connected to the odd bit line BLo. This reduces the potential difference between the gate (applied with the pass voltage Vpass) and the channel of each of the memory cell transistors, thereby suppressing the occurrence of a read disturb phenomenon. To accomplish this, the power supply voltage Vcc applied to the odd bit line BLo is at a level equal to or higher than a bias used for turning on the string selection transistors 411 and 421 and the source selection transistors 412 and 422.

An appropriate bias level is applied to word lines crossing the cell strings 410 and 420 in order to facilitate the step 520. Specifically, a read voltage Vread (e.g., 0V) is applied to the word line of the selected memory cell transistor 435. On the other hand, a pass voltage Vpass (e.g., a voltage equal to or higher than 5V) is applied to the word lines of the remaining memory cell transistors 430, the word line of the string selection transistor 411, and the word line of the source selection transistor 412.

Under these bias conditions, transistors and a latch that constitute the page buffer 600 are appropriately controlled to sense the state of the selected memory cell transistor 435, i.e., to sense whether the selected memory cell transistor 435 is in the erased or programmed state (step 530). When the memory cell transistor 435 is in the erased state, the read voltage Vread turns on the memory cell transistor 435 to allow charges precharged on the even bit line BLe to be discharged through the cells and to the cell source line CSLe, thereby causing the precharged voltage to drop to 0V. On the other hand, when the memory cell transistor 435 is in the programmed state, the memory cell transistor 435 is kept off even though the read voltage Vread is applied to the gate. This prevents charges precharged on the even bit line BLe from being discharged to the cell source line CSLe, thereby keeping the precharged voltage substantially unchanged. Data sensing is performed by sensing whether or not the precharged voltage on the even bit line BLe has been changed.

Figure 6:
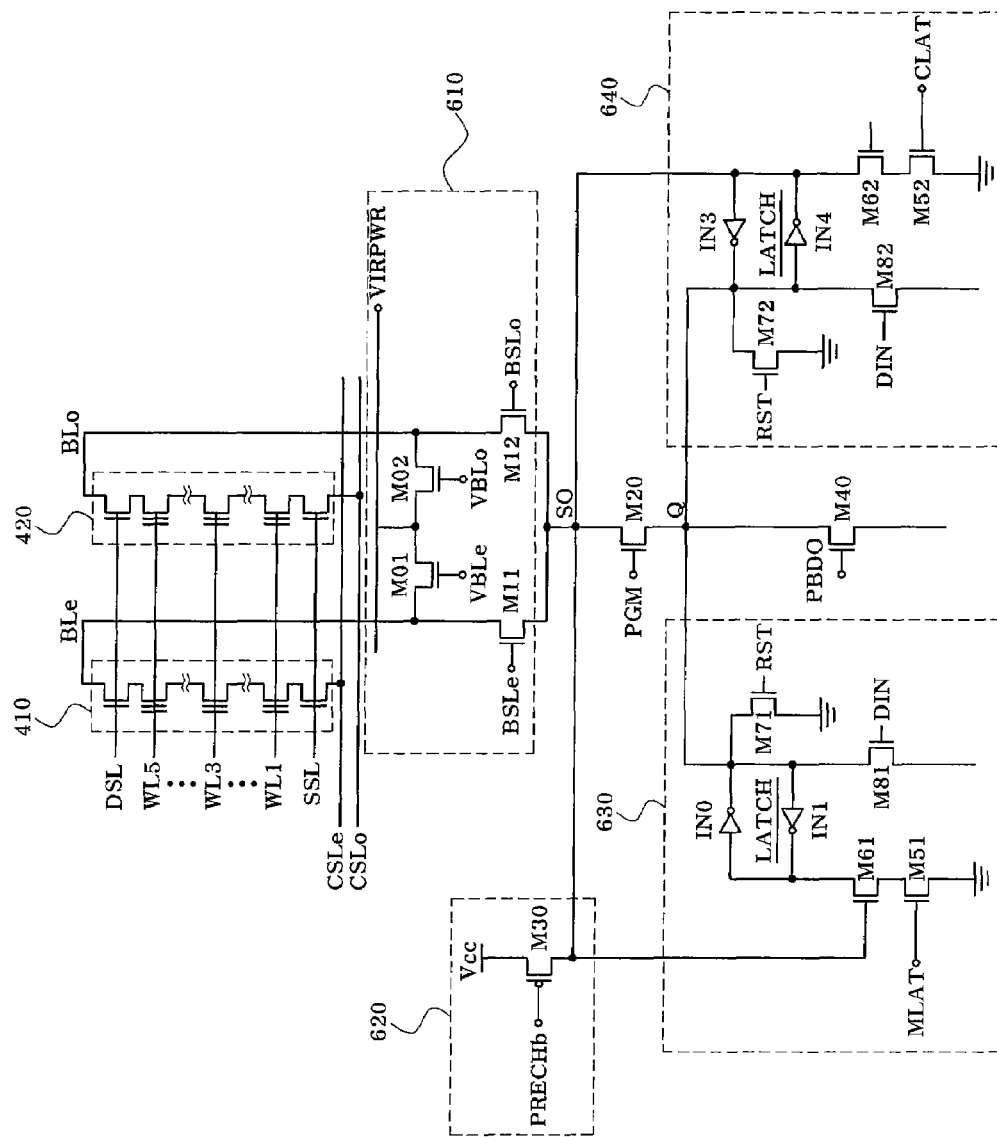
FIG. 6 illustrates a page buffer that controls the operation of a NAND flash memory device according to the present invention.

When the data sensing of the selected even bit line BLe has been performed, the state of a sensing node SO in the page buffer 600 is determined (see FIG. 6). If the precharged voltage on the even bit line BLe drops to 0V, then the voltage of the sensing node also drops to 0V. If the precharged voltage on the even bit line BLe is maintained, then the voltage of the sensing node is also maintained at the power supply voltage Vcc. Once the state of the sensing node has been determined, data latching is performed in the page buffer 600 to determine the state of a Q node according to the state of the sensing node (step 540). If the voltage of the sensing node SO drops to 0V, the Q node is maintained at a low level. On the other hand, if the voltage of the sensing node is maintained at the power supply voltage Vcc, the Q node is changed from low to high. Then, recovery of the bit lines BLe and BLo is performed and the detected data is also stored in one or more latches in the page buffer 600 (step 550).

The power supply voltage (Vcc) bias is applied to the memory cell transistors 440, to the gates of which the pass voltage Vpass is applied, among the memory cell transistors 440 connected to the unselected odd bit line BLo at the previous step of precharging the even bit line BLe. Therefore, even though a pass voltage Vpass higher than 5.5V is applied to the gates of the memory cell transistors 440 while the data sensing, data latching, and recovery steps are performed, a bias, which is only as high as the difference between the pass voltage Vpass and the power supply voltage Vcc, is applied to the memory cell transistors 440, thereby preventing the pass voltage Vpass from undesirably programming the memory cell transistors 440.

However, when all the memory cell transistors 440 connected to the odd bit line BLo are in the erased state, the power supply voltage (Vcc) applied to the odd bit line BLo may be discharged to the cell source line CSL if a common cell source line is used for both the cell string strings 410 and 420.

Accordingly, two separate the cell source lines CSLe and CSLo are used for the even bit line BLe and the cell source line CSLo of the odd bit line BLo, respectively. By using two separate the cell source lines CSLe and CSLo, it is possible to keep the cell source line CLSe grounded while applying a voltage, e.g., the power supply voltage Vcc, to the cell source line CSLo.

FIG. 6 illustrates a page buffer that controls the operation of a NAND flash memory device according to the present invention. As shown in FIG. 6, the page buffer 600 includes a bit line selection and bias circuit 610, a precharge circuit 620, a main register circuit 630, and a cache register circuit 640. In the following, this embodiment is exemplified by the page buffer 600 that can be applied to a multi-level cell (MLC) structure. When the page buffer 600 is applied to a single level cell (SLC) structure, its basic configuration and operation is similar to that of the page buffer 600 applied to the MLC structure, with the only difference being that it uses one register circuit instead of the two register circuits 630 and 640. The bit line selection and bias circuit 610 operates to select one of the even and odd bit lines BLe and BLo and also to apply a preset bias to a bit line selected from the even and odd bit lines BLe and BLo. The precharge circuit 620 operates to precharge the selected bit line with a specific voltage level. The main register circuit 630 latches and stores MSB data that is the first bit of a 2-bit data. The cache register circuit 640 latches and stores LSB data that is the last bit of a 2-bit data.

The bit line selection and bias circuit 610 includes 4 nMOS transistors M01, M02, M11, and M12. The nMOS transistor M01 is arranged between a power line VIRPWR and an even bit line BLe and is controlled according to a VBLe control signal. The nMOS transistor M02 is arranged between the power line VIRPWR and an odd bit line BLo and is controlled according to a VBLo control signal. The nMOS transistor M11 is arranged between the even bit line BLe and a sensing node SO and is controlled according to a BSLe control signal. The nMOS transistor M12 is arranged between the odd bit line BLo and the sensing node SO and is controlled according to a BSLo control signal.

The precharge circuit 620 includes a pMOS transistor M30. The pMOS transistor M30 is arranged between the power source voltage Vcc and the sensing node SO and is controlled according to a PRECHb control signal.

The main register circuit 630 includes nMOS transistors M51, M61, M71, and M81 and a latch including two inverters IN0 and IN1. The nMOS transistors M61 and M51 are arranged between ground and an output of the inverter IN1 included in the latch (which is the same as an input of the inverter IN0). A gate of the nMOS transistor M61 is connected to the sensing node SO, so that it is switched according to the voltage of the sensing node SO. The nMOS transistor M51 is controlled according to an MLAT control signal. The nMOS transistor M71 is arranged between ground and a Q node of the latch (i.e., the output of the inverter IN0 which is the same as the input of the inverter IN1) and is controlled according to an RST control signal. The nMOS transistor M81 is arranged between the Q node of the latch and an external data input line and is controlled according to a DIN control signal.

The cache register circuit 640 also includes nMOS transistors M52, M62, M72, and M82 and a latch including two inverters IN3 and IN4. The nMOS transistors M62 and M52 are arranged between ground and an output of the inverter IN4 included in the latch (which is the same as an input of the inverter IN3). A connection node between the nMOS transistor M62 and the latch is also connected to the sensing node SO. The nMOS transistor M52 is controlled according to a CLAT control signal. The nMOS transistor M72 is arranged between ground and a Q node of the latch (i.e., the output of the inverter IN3 which is the same as the input of the inverter IN4) and is controlled according to an RST control signal. The nMOS transistor M82 is arranged between the Q node of the latch and an external data input line and is controlled according to a DIN control signal.

Figure 7:
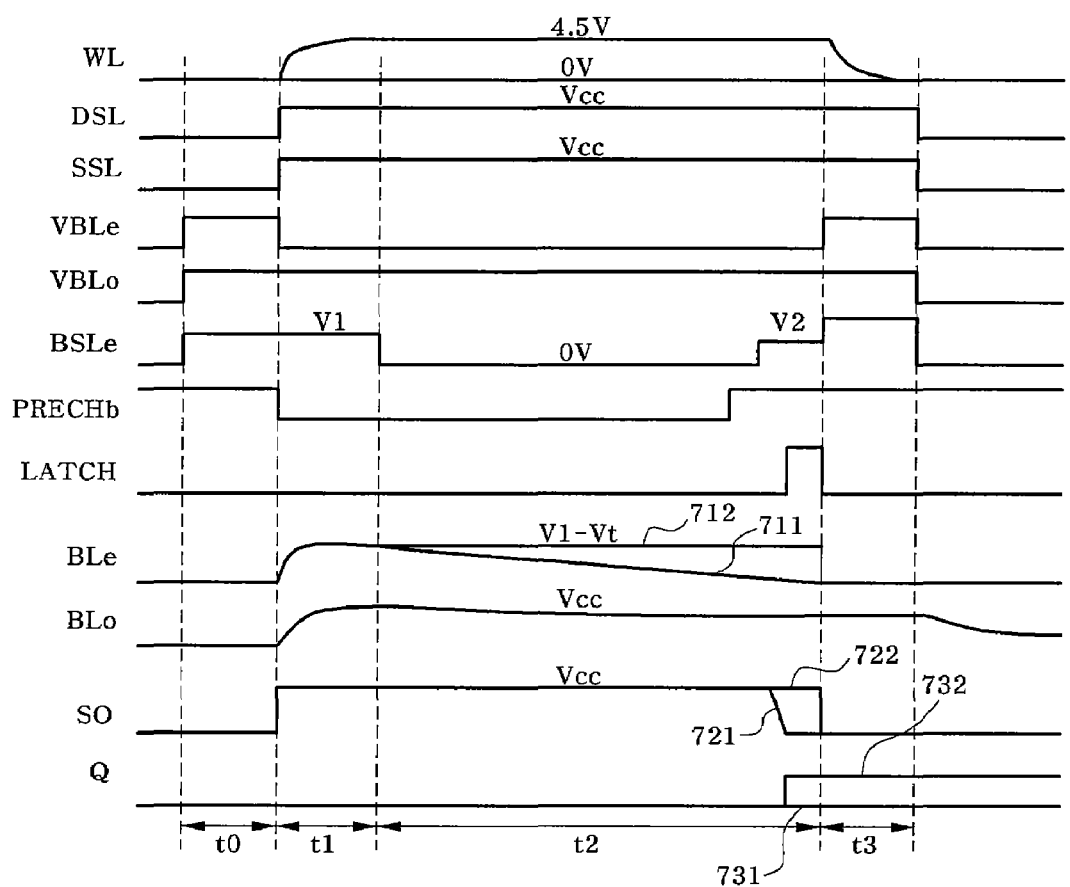
FIG. 7 is a timing diagram of a page buffer applied to a method for reading a NAND flash memory device according to the present invention.

FIG. 7 is a timing diagram of a page buffer applied to a method for reading a NAND flash memory device according to the present invention. Referring to FIGS. 6 and 7, the step of discharging the selected even bit line BLe and setting the page buffer 600 is performed in a first time interval t0. During this time interval, a low signal is input to the gates of the string selection transistors, the source selection transistors, and the memory cell transistors in the cell strings 410 and 420. The VBLe control signal, the VBLo control signal, the BSLe control signal, the BSLo control signal, and the PRECHb control signal in the page buffer 600 are all high. Accordingly, the nMOS transistors M01, M02, M11, and M12 are turned on and the pMOS transistor M30 is turned off. The power supply line VIRPWR is grounded. Since the nMOS transistors M01 and M02 are turned on, all charges stored on the even and odd bit lines BLe and BLo flow to the grounded power supply line VIRPWR through the nMOS transistors M01 and M02. Accordingly, the even and odd bit lines BLe and BLo are all discharged. In addition, a high PGM control signal is applied to turn on the transistor M20, thereby setting the Q node to a low level. During this time interval, the nMOS transistors M11 and M12 are on, thereby setting the sensing node SO to a low level.

The step of precharging the selected bit line while applying the power supply voltage Vcc to the unselected bit line is performed in a second time interval t1. Once the second time interval t1 starts, the power supply voltage Vcc is applied to the drain selection line DSL and the source selection line SSL connected to the gates of the string selection transistors and the source selection transistors in the cell strings 410 and 420 to turn on these transistors. Also a read voltage Vread (e.g., 0V) or a pass voltage Vpass (e.g., 4.5V) begins to be applied to the word lines WL of the memory cell transistors in the cell strings. Specifically, the read voltage Vread is applied to the word line of the selected memory cell transistor and the pass voltage Vpass is applied to the word lines of the remaining memory cell transistors.

In the page buffer 600, the VBLe control signal, the BSLo control signal, and the PRECHb control signal are switched to low while the power supply voltage Vcc is applied to the power supply line VIRPWR. Accordingly, the nMOS transistors M01 and M12 are turned off and the pMOS transistor M30 is turned on. As the pMOS transistor M30 is turned on, the Vcc voltage is applied to the sensing node SO. Since a V1 voltage (e.g., about 2V) is applied as the BSLe control signal to the gate of the nMOS transistor M11, the voltage of the even bit line BLe begins to increase. When the level of the gate-source voltage Vgs of the nMOS transistor M11 reaches the threshold voltage Vth, the voltage of the even bit line BLe no longer increases. Accordingly, the even bit line BLe is precharged to a voltage level of (V1−Vth).

Generally, 0V is applied to the unselected odd bit line BLo according to the bit line shielding technology. However, the power supply voltage Vcc at is applied to the unselected odd bit line BLo according to the present invention. Specifically, since the nMOS transistor M12 is turned off and the nMOS transistor M02 is turned on, the power supply voltage Vcc is applied to the odd bit line BLo through the power supply line VIRPWR. The power supply voltage Vcc applied to the odd bit line BLo is then applied to the channels of the memory cell transistors in the cell string 420 connected to the odd bit line BLo. In subsequent processes, this applied bias boosts the channels of the memory cell transistors, thereby suppressing the occurrence of a read disturb phenomenon.

After precharging the even bit line BLe and applying the power supply voltage Vcc to the odd bit line BLo, data sensing is performed in a third time interval t2. This third time interval t2 includes an evaluation time that is the time required to sufficiently discharge charges that have been precharged on the even bit line BLe. After the evaluation time elapses, the PRECHb control signal is switched to high to turn off the pMOS transistor M30. A V2 voltage (e.g., about 1.7V) lower than the V1 voltage is applied as the BSLe control signal to the gate of the nMOS transistor M11.

In the case where the selected memory cell transistor is on (i.e., in the erased state), charges precharged on the even bit line BLe are discharged through the cells, thereby reducing the voltage of the even bit line BLe below (V2−Vth) (see "711" in FIG. 7). This causes the gate-source voltage Vgs of the nMOS transistor M11 to be higher than the threshold voltage Vth, thereby turning on the nMOS transistor M11. As the nMOS transistor M11 is turned on, charges stored on the sensing node SO are abruptly discharged to the even bit line BLe due to charge distribution between the capacitance of the even bit line BLe and the capacitance of the sensing node SO. As a result, the voltage of the sensing node SO drops from the power supply voltage Vcc to 0V (see "721" in FIG. 7).

In the case where the selected memory cell transistor is off (i.e., in the programmed state), charges precharged on the even bit line BLe are prevented from being discharged through the cells, so that the voltage of the even bit line BLe is maintained at the (V1−Vth) voltage (see "712" in FIG. 7). Accordingly, even though a V2 voltage is applied as the BSLe control signal to the gate of the nMOS transistor M11, the gate-source voltage Vgs of the nMOS transistor M11 is still kept equal to the threshold voltage Vth, so that the nMOS transistor M11 is not turned on. As a result, the sensing node SO is maintained at the power supply voltage Vcc (see "722" in FIG. 7).

After performing the data sensing step, data latching is performed in a fourth time interval t3. Specifically, in the case where the selected memory cell transistor is on (i.e., in the erased state), the sensing node SO drops to 0V so that the nMOS transistor M61 is kept off and accordingly the Q node is also kept at a low level (see "731" in FIG. 7). In the case where the selected memory cell transistor is off (i.e., in the programmed state), the sensing node SO is kept at the power supply voltage Vcc so that the nMOS transistor M61 is turned on and accordingly the Q node is switched from low to high (see "732" in FIG. 7). After the data sensing is completed, the bit lines are recovered and the sensed data is stored. At this step, all the bit lines are discharged through the power supply line VIRPWR and all the latches in the page buffer 600 store the sensed data. While the data sensing, latching, and recovery steps are performed in this manner, the power supply voltage Vcc is kept applied to the unselected odd bit line BLo. Accordingly, the channels of the memory cell transistors connected to the odd bit line BLo are boosted by the power supply voltage Vcc even though the pass voltage Vpass is applied to the memory cell transistors. As a result, a bias at a level lower than the pass voltage Vpass is applied to the channels, thereby preventing the occurrence of a read disturb phenomenon in which the memory cell transistors are undesirably programmed. However, in the case where the memory cell transistors connected to the odd bit line BLo are all in the erased state, i.e., when the entire cell string 420 connected to the odd bit line BLo allows current to flow, the power supply voltage Vcc applied to the odd bit line BLo may be discharged to the grounded common cell source line CSL. To prevent this, the cell source line CSLo connected to the odd bit line BLo is separated from the cell source line CSLe connected to the even bit line BLe. In addition, the cell source line CSLe connected to the even bit line BLe is grounded while a voltage at a specific level (e.g., the same level as that of the power supply voltage Vcc applied to the odd bit line BLo) is applied to the cell source line CSLo connected to the odd bit line BLo.

As is apparent from the above description, a method for reading a NAND flash memory device according to the present invention has a variety of advantages. For example, a voltage at a specific level is applied to an unselected bit line. Accordingly, even though the level of a pass voltage applied to word lines of gates of memory cell transistors that are not selected during a read operation is increased, the level of a bias applied between the gate and channel of each of the unselected memory cell transistors is reduced by the level of the bias applied to the unselected bit line. This prevents the occurrence of a read disturb phenomenon, thereby improving the reliability of the device.

What is claimed is:

1. A method for reading a NAND flash memory device, the method comprising:
   applying a first voltage to a first bit line coupled to a first cell string, the first cell string including a first string selection transistor, a plurality of first memory cells, and a first source selection transistor;
   applying a second voltage to a second bit line coupled to a second cell string, the second cell string including a second string selection transistor, a plurality of second memory cells, and a second source selection transistor;
   turning on the first and second string selection transistors;
   applying a read voltage to a selected memory cell;
   applying a pass voltage to unselected memory cells; and
   determining a state of the selected memory cell according to a voltage condition associated with the first bit line,
   wherein the second voltage applied to the second bit line reduces a potential difference between a gate and a channel of the unselected memory cells.

2. The method of claim 1, wherein the first voltage is applied to the first bit line to precharge the first bit line, and the second voltage is applied to the second bit line is a power supply voltage.

3. The method according to claim 1, further comprising:
   discharging the first and second bit lines to reset a page buffer coupled to the first and second bit lines.

4. The method according to claim 1, wherein the first source selection transistor is coupled to a first cell source line, and the second source selection transistor is coupled to a second cell source line,
   wherein the first and second cell source lines are different cell source lines.

5. The method according to claim 4, further comprising:
   grounding the first cell source line of the first bit line; and;
   applying a predetermined voltage to the second cell source line of the second bit line.

6. The method according to claim 5, wherein the specific voltage applied to the second cell selection line of the second bit line is substantially the same in potential as the second voltage applied to the second bit line.

7. The method according to claim 1, wherein the second voltage applied to the second bit line is equal to or higher than a bias for turning on the second string selection transistor.

8. The method according to claim 7, wherein the second voltage applied to the second bit line is equal to or higher than a bias for turning on the second source selection transistor.

9. The method according to claim 1, wherein the pass voltage is no less than 5.5V.

* * * * *